(12) United States Patent
Verbrugge et al.

(10) Patent No.: US 10,901,042 B2
(45) Date of Patent: Jan. 26, 2021

(54) METHOD AND APPARATUS FOR EVALUATING BATTERY CELLS CONTAINING MATERIALS THAT EXHIBIT VOLTAGE HYSTERESIS

(71) Applicant: GM Global Technology Operations LLC, Detroit, MI (US)

(72) Inventors: Mark W. Verbrugge, Troy, MI (US); Daniel R. Baker, Romeo, MI (US); Xingcheng Xiao, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 470 days.

(21) Appl. No.: 15/934,161

(22) Filed: Mar. 23, 2018

(65) Prior Publication Data

US 2018/0306865 A1   Oct. 25, 2018

Related U.S. Application Data

(60) Provisional application No. 62/489,813, filed on Apr. 25, 2017.

(51) Int. Cl.
*H02J 7/00* (2006.01)
*G01R 31/3835* (2019.01)
(Continued)

(52) U.S. Cl.
CPC ........ *G01R 31/3835* (2019.01); *H02J 7/0021* (2013.01); *H02J 7/1446* (2013.01);
(Continued)

(58) Field of Classification Search
CPC ................................................. G01R 31/3835
(Continued)

(56) References Cited

U.S. PATENT DOCUMENTS 8,018,202 B2 * 9/2011 Masson ................ G01R 31/396
320/136
2002/0014879 A1 * 2/2002 Koike .................... H02J 7/0069
320/133
(Continued)

FOREIGN PATENT DOCUMENTS

CN         101371155 A    2/2009
CN         102062841 A    5/2011
(Continued)

*Primary Examiner* — Yalkew Fantu
(74) *Attorney, Agent, or Firm* — Quinn IP Law

(57) ABSTRACT

A method for determining a state of charge (SOC) of a rechargeable battery cell includes determining a rate-invariant charge/discharge relationship between an open-circuit voltage (OCV) and a state of charge (SOC). This includes a first finite-rate voltage scan following a reduction branch of a relationship between OCV and the SOC, and executing a second finite-rate voltage scan following an oxidation branch of a relationship between OCV and the SOC. A rate-dependent charge/discharge relationship between the OCV and the SOC is determined during scanned voltage transitions between the reduction and oxidation branches. A present SOC state is determined based upon an electrical potential, the rate-invariant charge/discharge relationship between the OCV and the SOC, and the rate-dependent charge/discharge relationship between the OCV and the SOC during a voltage-scan reversal that occurs when the scanned voltage transitions between the reduction and oxidation branches.

18 Claims, 6 Drawing Sheets

(51) Int. Cl.
*H02J 7/14* (2006.01)
*G01R 31/367* (2019.01)

(52) U.S. Cl.
CPC .......... *G01R 31/367* (2019.01); *H02J 7/0047* (2013.01); *H02J 7/0078* (2013.01)

(58) Field of Classification Search
USPC ........................................................ 320/132
See application file for complete search history.

(56) References Cited

U.S. PATENT DOCUMENTS

2011/0161025 A1* 6/2011 Tomura .................. G06F 19/00
702/63
2013/0300425 A1* 11/2013 Shiraishi ............ G01R 31/3835
324/426

FOREIGN PATENT DOCUMENTS

| CN | 102144169 A | 8/2011 |
| CN | 103389466 A | 11/2013 |
| CN | 105842627 A | 8/2016 |

\* cited by examiner

METHOD AND APPARATUS FOR EVALUATING BATTERY CELLS CONTAINING MATERIALS THAT EXHIBIT VOLTAGE HYSTERESIS

CROSS-REFERENCE TO RELATED APPLICATIONS

This application claims the benefit of U.S. Provisional Patent Application No. 62/489,813 filed on Apr. 25, 2017, the disclosure of which is hereby incorporated by reference.

INTRODUCTION

Lithium-based battery cells can be employed to electrify vehicles and consumer electronic devices.

SUMMARY

A method and device for determining a state of charge (SOC) and charging a rechargeable battery cell including an electrode is described. The method includes determining a rate-invariant charge/discharge relationship between an open-circuit voltage (OCV) and a state of charge (SOC) for the battery cell, which includes executing a first finite-rate voltage scan associated with a state of dynamic equilibrium in which a scanned voltage follows a reduction branch of a relationship between OCV and the SOC, and executing a second finite-rate voltage scan associated with a state of dynamic equilibrium in which the scanned voltage follows an oxidation branch of a relationship between OCV and the SOC. A rate-dependent charge/discharge relationship between the OCV and the SOC for the battery cell is determined during a period in which the scanned voltage transitions between the reduction and oxidation branches. An electrical potential for the battery cell is dynamically determined. A present SOC state for the battery cell is determined based upon the electrical potential for the battery cell, the rate-invariant charge/discharge relationship between the OCV and the SOC for the battery cell, and the rate-dependent charge/discharge relationship between the OCV and the SOC for the battery cell during a voltage-scan reversal that occurs when the scanned voltage transitions between the reduction and oxidation branches. Charging of the battery cell is controlled based upon the present SOC state for the battery cell.

An aspect of the disclosure includes the electrical potential for the battery cell (U) in relation to the SOC for the battery cell (x) being indicated in accordance with the relationship:

$$U = U_{avg}(x) + U_{max}(x)\varsigma, \quad -1 \leq \varsigma \leq 1$$

$$U_{avg}(x) = \frac{U^1(x) + U^0(x)}{2}, \quad U_{max}(x) = \frac{U^1(x) - U^0(x)}{2}.$$

The rate-dependent charge/discharge relationship between the OCV and the SOC for the battery cell during the voltage-scan reversal is determined in accordance with the relationship:

$$\left|\tanh\left(\frac{\alpha}{x}\frac{dx}{dt}\right)\right| < 0.97$$

The rate-invariant charge/discharge relationship between the OCV and the SOC for the battery cell during the voltage-scan reversal is determined in accordance with the relationship:

$$\left|\tanh\left(\frac{\alpha}{x}\frac{dx}{dt}\right)\right| \geq 0.97$$

The terms include $\alpha$, which represents a fitting factor having units of time and associated with a stress function $\varsigma$; x, which represents the SOC; and t, which represents time.

Another aspect of the disclosure includes a change in the stress function $\varsigma$ in relation to time being indicated in accordance with the relationship:

$$\frac{d\varsigma}{dt} = -k\left(\tanh\left(\frac{\alpha}{x}\frac{dx}{dt}\right) + \varsigma\right)$$

and $$k = \begin{cases} K\left|\frac{dx}{dt}\right| \text{ or } \left|\frac{dx}{dt}\right| \geq \chi \\ K\chi \text{ for } \left|\frac{dx}{dt}\right| < \chi \end{cases} \text{ where } \tanh\left(\frac{\alpha}{x}\chi\right) = 0.97, \text{ and } \chi = \frac{x}{\alpha}2.092...$$

The terms include $\alpha$, which represents the fitting factor in relation to the stress function $\varsigma$; K, which is a constant; $\chi$, which represents a boundary between rate-invariant and rate-dependent behavior; $\varsigma$, which represents stress; x, which represents the SOC, and t, which represents time.

Another aspect of the disclosure includes the rate-invariant charge/discharge relationship including a hysteretic relationship between the OCV and the SOC.

Another aspect of the disclosure includes determining the rate-invariant charge/discharge relationship between the OCV and the SOC for the battery cell, including determining a mathematical expression for the rate-invariant charge/discharge relationship between the OCV and SOC for the battery cell, and generating executable algorithmic code representing the mathematical expression for the rate-invariant charge/discharge relationship between the OCV and SOC for the battery cell.

Another aspect of the disclosure includes the mathematical expression for the rate-invariant charge/discharge relationship between the OCV and SOC for the battery cell being an ordinary differential equation, wherein generating executable algorithmic code representing the mathematical expression for the rate-invariant charge/discharge relationship between the OCV and SOC for the battery cell includes executing, via the controller, a numerical method to determine a numerical solution to the ordinary differential equation.

Another aspect of the disclosure includes the first finite-rate voltage scan being a rate-invariant scan.

Another aspect of the disclosure includes the first finite-rate voltage scan being a rate of –0.01 mV/s.

Another aspect of the disclosure includes the second finite-rate voltage scan being a rate-invariant scan.

Another aspect of the disclosure includes the second finite-rate voltage scan being a rate of 0.01 mV/s.

Another aspect of the disclosure includes the second finite-rate voltage scan associated with the state of dynamic equilibrium in which the scanned voltage follows the oxidation branch of the relationship between the OCV and the SOC being associated with lithiation of the electrode of the battery cell.

Another aspect of the disclosure includes the first finite-rate voltage scan associated with the state of dynamic equilibrium in which the scanned voltage follows the reduction branch of the relationship between the OCV and the SOC being associated with delithiation of the electrode of the battery cell.

The above features and advantages, and other features and advantages, of the present teachings are readily apparent from the following detailed description of some of the best modes and other embodiments for carrying out the present teachings, as defined in the appended claims, when taken in connection with the accompanying drawings.

BRIEF DESCRIPTION OF THE DRAWINGS

One or more embodiments will now be described, by way of example, with reference to the accompanying drawings, in which.

Figure 2:
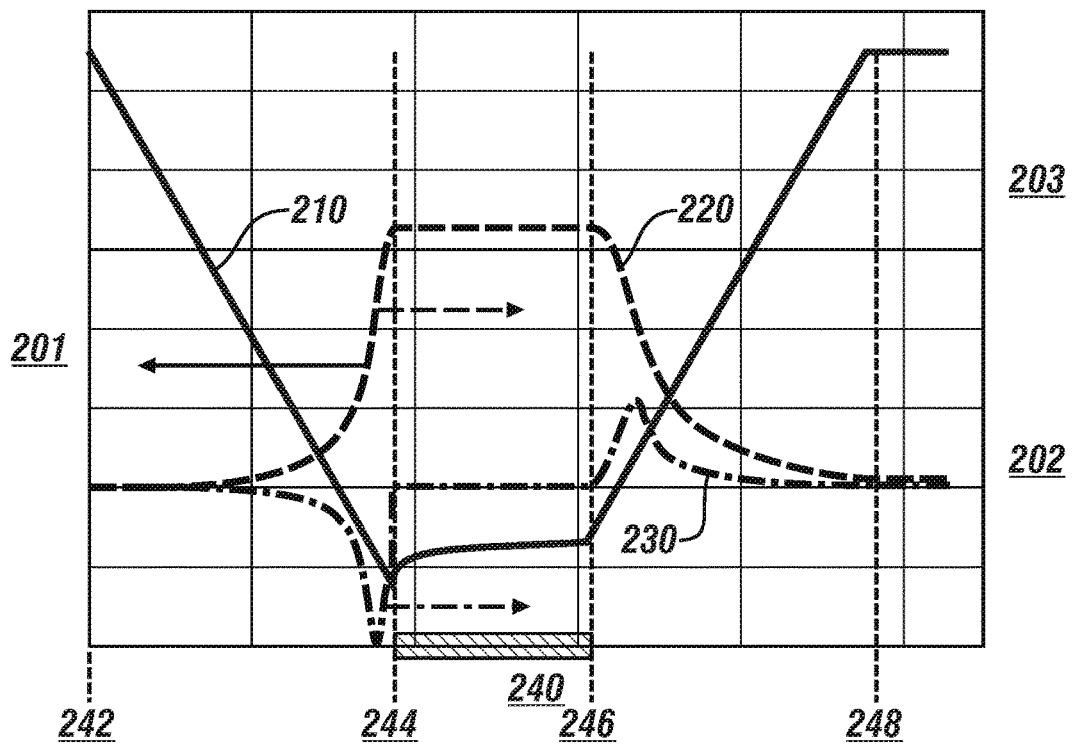
FIG. 2 graphically shows voltammetry data associated with a rechargeable battery cell, the data captured at 0.01 mV/s, starting at 1.5 V and sweeping down to 0.16 V, at which point the current is interrupted for a period of 24 hr., and afterwards the sweep rate is reversed but held at the same scan rate until reaching 1.5 V again, in accordance with the disclosure.
Figure 8:
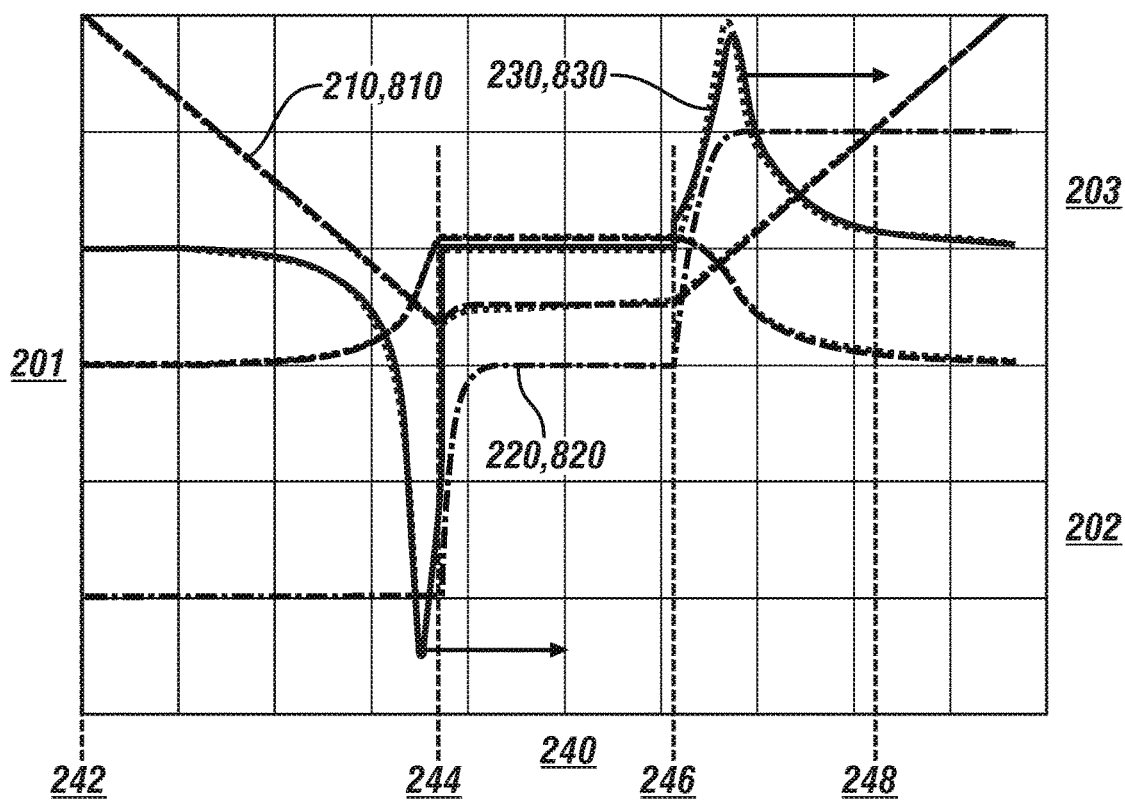
Figure 9:
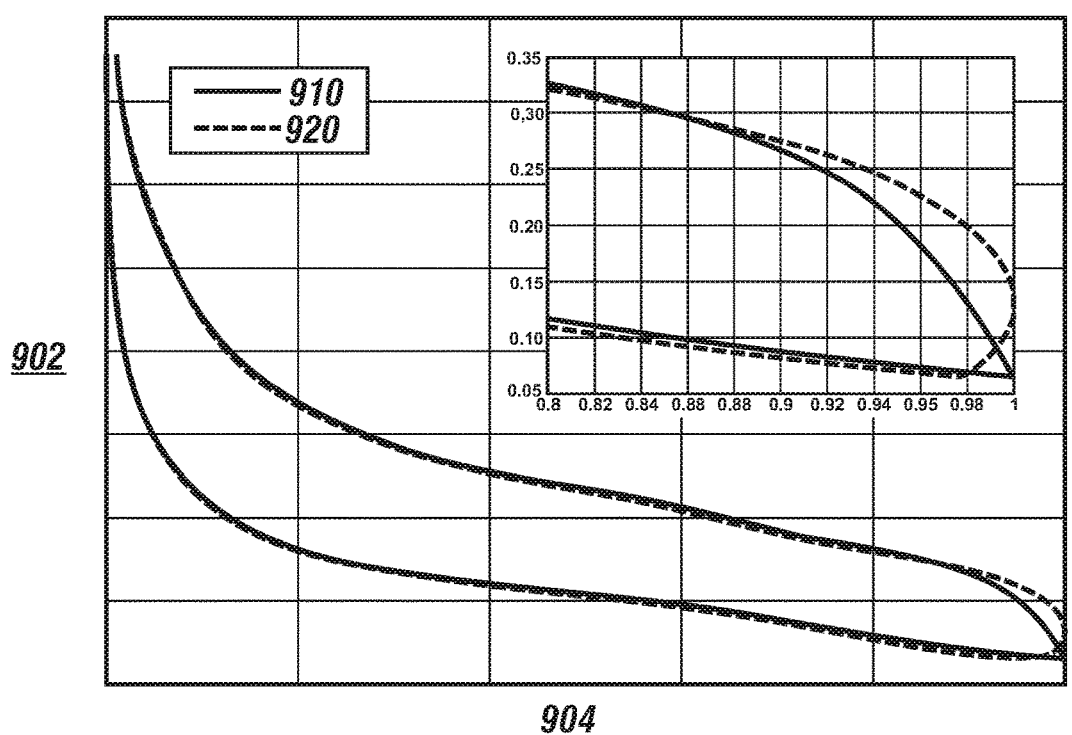

in accordance with the disclosure;

FIG. 8 shows data associated with a rechargeable battery cell, the data including a model comparison with the data shown in FIG. 2, using values $\alpha$=30 hr. and K=25, in accordance with the disclosure; and FIG. 9 shows data associated with a rechargeable battery cell, the data including model simulations of a current cycle at C/40 and linear voltammetry at 0.01 mV/s, using the same values $\alpha$=30 hr. and K=25 as in FIG. 8, in accordance with the disclosure.

DETAILED DESCRIPTION

The components of the disclosed embodiments, as described and illustrated herein, may be arranged and designed in a variety of different configurations. Thus, the following detailed description is not intended to limit the scope of the disclosure, as claimed, but is merely representative of possible embodiments thereof. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure. Furthermore, the disclosure, as illustrated and described herein, may be practiced in the absence of an element that is not specifically disclosed herein.

The drawings refer to a DC power device 15 in communication with a controller 12. The DC power device 15 that may be employed to supply DC electric power to a vehicle, including being employed to supply electric power to an electric machine that provides mechanical power for tractive effort. The vehicle may include, but not be limited to a mobile platform in the form of a commercial vehicle, industrial vehicle, agricultural vehicle, passenger vehicle, aircraft, watercraft, train, all-terrain vehicle, personal movement apparatus, robot and the like to accomplish the purposes of this disclosure. Alternatively, the DC power device 15 may be employed in any suitable device that employs electric power to accomplish a task, including, but not limited to consumer electronic devices such as cellular phones, portable computing devices, etc. The terms "DC power device", "battery", "battery cell" and "cell" are employed interchangeably throughout the specification. In one embodiment, the DC power device is configured with silicon electrodes that effect an electrical charge by migration of lithium. The term "curve" is employed herein to describe a relationship between identified parameters, wherein the curve also indicates a graphical depiction of the relationship between the identified parameters.

Hysteretic behavior can be observed in lithiated silicon electrodes through the development and implementation of a model that describes the main features of the observed voltage hysteresis and is capable of being reduced to an executable algorithm. Specifically, slow-scan voltammetry at 0.01 mV/s can be used to study hysteresis in lithiated silicon thin-film electrodes. At higher scan rates, the curves U(x), where U is voltage and x is state of charge, depend on scan rate, but no difference is seen in the curves when scanning at slow enough rates. For example, no difference is seen at 0.01 mV/s or at 0.005 mV/s, even though the same hysteretic behavior is observed for both scan rates; i.e., the lithiation curve differs significantly from the delithiation curve. The rate of 0.005 mV/s is the slowest that could be measured with state-of-the-art equipment. However, when a lithiating scan at 0.01 mV/s is suddenly set to open circuit conditions, the voltage slowly decays upwards, whereas voltage decays downwards when delithiation is interrupted. From this it is inferred that the rate invariance seen at 0.005 and 0.01 mV/s would have to break down at some lower scan rate, if it could be measured. A semi-empirical model is used to describe many aspects of this behavior based on the assumption of a region of rate invariance, which breaks down at higher scan rates due to transport and kinetic losses, but which also breaks down at slower scan rates due to other transients that are observable.

Silicon can be employed as an anode electrode material in a lithium-based battery. Examples of lithium-based batteries include, by way of non-limiting examples, Li—Si, LiPO$_4$, Li—SiO$_x$, and others. When silicon is employed as an anode electrode material in a lithium-based battery, there can be hysteresis in the open-circuit voltage (OCV) when plotted in relation to a state of charge (SOC) of a lithiated silicon electrode, depending upon whether in a charging mode or a discharging mode.

When an electrode material exhibits no hysteresis, the OCV of a partially lithiated host material with respect to a lithium reference electrode depends on the thermodynamic variables of the host material, including the SOC, or mole fraction of available sites occupied by lithium x, stress, temperature, and potentially other intensive variables. In contrast, the OCV of a material that exhibits hysteresis depends on whether the material is being lithiated, i.e., charged, or delithiated, i.e., discharged. Because the OCV should be viewed as a measurement made at thermodynamic equilibrium, the existence of hysteresis poses difficult questions regarding the interpretation of such measurements. Hysteresis arises in many different contexts, e.g., the relationship describing magnetization versus applied field strength for ferromagnetic materials and force-displacement curves for various structural and semi-structural materials, and much work has been devoted to understanding the causes of hysteresis and its relation to equilibrium thermodynamics. Regardless of the type of physical system considered, hysteresis phenomena are an indication that the system is living for long times in states that are far from thermodynamic equilibrium. Therefore, in principle the observed behavior should be interpreted in the frame of non-equilibrium thermodynamics. As a consequence, simplified approximate models based on reasonable phenomenological assumptions can be employed to interpret and accommodate hysteresis phenomena.

Data associated with slow-scan voltammetry data taken on thin silicon films can be described as follows. Hysteresis may be attributed to the coexistence of domains of different states to generate time-independent hysteresis loops. A Preisach model can be employed to describe hysteresis phenomena associated with the open-circuit voltage of a nickel hydroxide electrode and associated with the open-circuit voltage of the lithium iron phosphate electrode. These constitute true rate-invariant approaches; in particular, slower rates (lower currents or slower potential scan rates) do not remove or change the hysteresis from the model results, a fact that may seem anomalous in the context of thermodynamics. A rate-invariant expression can be developed for nickel metal hydride battery systems, to which self-discharge was added. The same model can be developed for the characterization of a variety of lithium ion cells, and a close variant of the same model can be employed to the lithium silicon electrode operated in constant-current mode. While the comparison with Li—Si experimental data was good, the model may not adequately describe scan data. As described herein, there can be hysteresis in the context of charging and discharging electrodes that are fabricated employing Li—Si (including lithium silica).

The causes of OCV hysteresis in the case of Li—Si can be phenomenological in nature. The notion of rate invariance turns out to be somewhat more complicated than the description given above and can be generalized to describe the types of observed data. This can be best illustrated in the context of specific data, as follows.

Slow-scan voltammetry at rates of 0.01 mV/s and 0.005 mV/s were compared for silicon films over the voltage range from 1.5 V to 0.16 V, and it was found that the same path of voltage U vs. state of charge x was followed at either scan rate. Furthermore, the same voltage vs. lithium concentration plot at voltage sweep rates of 0.01 mV/s and constant-current cycling of C/40 have been observed, wherein the term C/40 is a C-rate, which is a term that is employed to describe a cell charging rate wherein the battery is charged from a 0% SOC to 100% SOC over a period of time in hours, e.g., 40 hours in this example. This state can be referred to as "dynamic equilibrium," and a formula relating current density to sweep rate can be derived under the same conditions. The sweep rate of 0.005 mV/s represents the lower limit of what can be accurately measured with state-of-the-art instrumentation. At higher sweep rates, the plots of voltage vs. lithium concentration start to deviate from those at dynamic equilibrium, presumably due to voltage losses from kinetics, solid-phase diffusion, and other rate-dependent irreversible processes. If the thin films were completely equilibrated at these sweep rates, one would expect the plot of voltage vs. lithium concentration to remain unchanged at sweep rates lower than 0.005 mV/s, if one could measure data at such slow rates, but the data to be presented here implies that this is not true. Instead, there appears to be a region of rate invariance, in which the voltage vs. SOC relationship is independent of voltage sweep rate or current, but at slower rates other transient effects become observable and the voltage vs. SOC relationship changes. The most explicit indication of this is the voltage decay that occurs when a voltage sweep is suddenly interrupted and held at open circuit conditions, which is shown with reference to FIG. 2. FIG. 2 graphically shows voltammetry data at 0.01 mV/s, starting at 1.5 V and sweeping down to 0.16 V, at which point the current is interrupted for a period of 24 hr. Afterwards the sweep rate is reversed but held at the same scan rate until reaching 1.5 V again.

Figure 1:
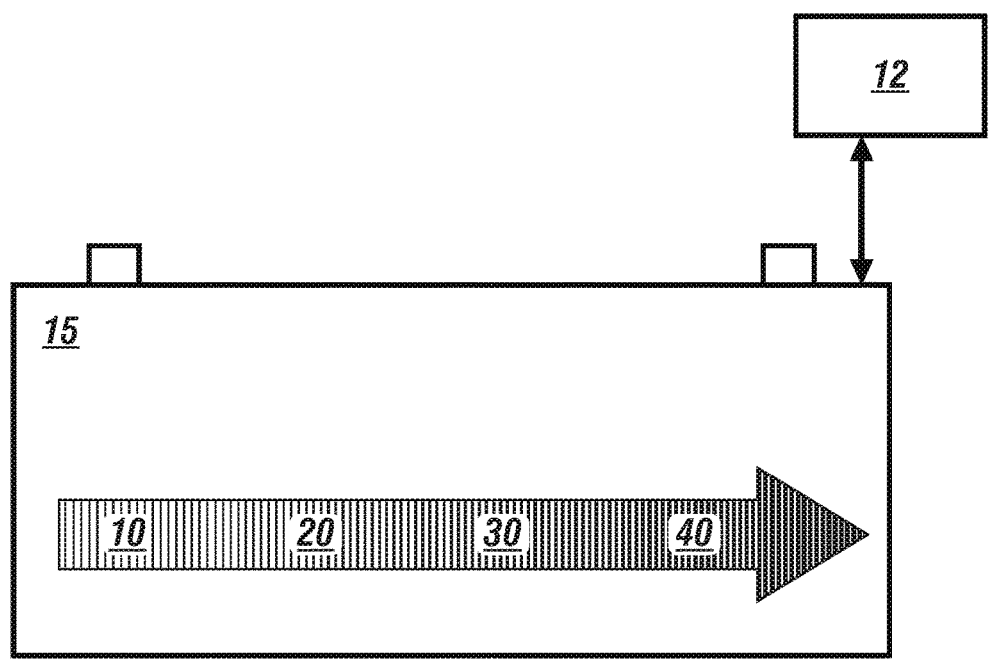
FIG. 1 schematically illustrates information related to a charge/discharge relationship between OCV and SOC for a rechargeable battery cell, including an onset and subsequent breakdown of rate-invariant behavior as a sweep rate or current is varied, in accordance with the disclosure.

At currents somewhere between what is seen in the voltammogram at 0.005 mV/s and open circuit, rate invariance is broken. If this were not the case, then the voltage would remain constant at open circuit, since the SOC is no longer changing. A schematic representation of this situation is shown in FIG. 1, which includes a schematic diagram illustrating the onset and subsequent breakdown of rate-invariant behavior as the sweep rate or current is varied. The truly reversible behavior referred to above may be obscured by secondary reactions. FIG. 1 is employed to depict effects of progressively increasing charging rates associated with the DC power device 15. When a rechargeable battery is subjected to conditions of an open circuit for an extended period, e.g., greater than 24 hours (10), reversible behavior occurs, without hysteresis. When the rechargeable battery is subjected to charging conditions at a low rate, e.g., less than 0.005 mv/s (20), the rechargeable battery exhibits some rate-dependent behavior with evidence of hysteresis. When the rechargeable battery is subjected to moderate charging conditions, e.g., between 0.005 and 0.01 mV/s (30), the rechargeable battery exhibits rate-invariant behavior with evidence of hysteresis. When the rechargeable battery is subjected to high charging conditions, e.g., greater than 0.05 mV/s (40), the rechargeable battery exhibits rate-dependent behavior that is associated with kinetics, diffusion and other irreversible processes.

The voltammetry data presented here correspond to a scan rate of 0.01 mV/s, in the region of rate invariance. In this data, the scan rate is reversed immediately at the end of each sweep. The results are then plotted in FIGS. 4 and 5 as voltage vs. SOC, and the results can be classified as follows. FIGS. 4 and 5 graphically show plotted data as voltage vs. SOC, wherein the voltammetry data corresponds to a scan rate of 0.01 mV/s, in the region of rate invariance, wherein the scan rate is reversed immediately at the end of each sweep. During a voltage scan at −0.01 mV/s a state of dynamic equilibrium is eventually reached in which the voltage follows the lithiation branch of the OCV vs. SOC curves. Behavior along this path is rate-invariant. When the scan is reversed so that voltage is increasing at 0.01 mV/s, a state of dynamic equilibrium is eventually reached in which the voltage follows the delithiation branch of the OCV vs. SOC curves. Behavior along this path is again rate-invariant. Just after voltage-scan reversal, a transitional period occurs in which the voltage moves between the lithiation and delithiation branches described above.

The plots of voltage vs. SOC in the transitional period have a different shape depending on whether linear sweep voltammetry is used or constant current cycling, as can be seen in FIG. 9. During constant-current cycling, the voltage direction switches at the same time that the current direction switches, whereas during linear voltammetry, there is a time lag after voltage scan reversal before the current changes sign (see, for example, FIG. 9 below). It follows from this that at least one of the above situations, if not both, must break rate-invariance.

An empirical approach is applied to model the data to develop a modeling strategy that can be used to capture, not only the rate-invariant behavior, but also the transitional regions. The result is a model that describes rate-invariant behavior and also predicts the way in which this behavior at very small currents or very slow voltage scan rates evolves into rate-dependent behavior. Very small currents or very slow voltage scan rates refer to times scales of practical interest. For example, in applications that include electrified vehicles and consumer electronics, battery charge and discharge times greater than 40 hours, i.e., C/40 are not of interest.

Experimental data was gathered employing silicon thin-films that were deposited on copper current collectors in a radio-frequency magnetron sputtering system. The deposition was conducted without substrate heating in order to obtain amorphous Si. The film thickness was monitored by a quartz-crystal microbalance and assembled with the Si thin film as the working electrode and a lithium foil as the counter-reference electrode, with a microporous membrane employed as a separator, and the electrolyte was a mixture of ethylene carbonate and diethyl carbonate (1:1 volume ratio) with 1M LiPF$_6$.

FIG. 2 graphically shows data plots of cell voltage 210, capacity 220, and current 230 in relation to time 240 during cycling with scales of cell voltage 201, capacity 202, and current 203 indicated on the vertical axes. The cell starts, at time t0 242 at a voltage of 1.5 volts, cycles down to a voltage of 160 mV at a scan rate of −0.01 mV/s, as indicated at time t1 244. At this point the cell was switched to an open circuit condition and allowed to rest for 24 hours while the change in voltage was recorded. After 24 hours, as indicated at time t2 246, the voltage scan was reversed and cycled at a rate of 0.01 mV/s back up to 1.5 V at time t3 248, where the voltage 210 was held constant. During the 24 hour rest period between times t1 242 and t2 244, the cell voltage 210 is seen to be decaying, although an equilibrium point may not have been reached at the end of the period.

Figure 3A:
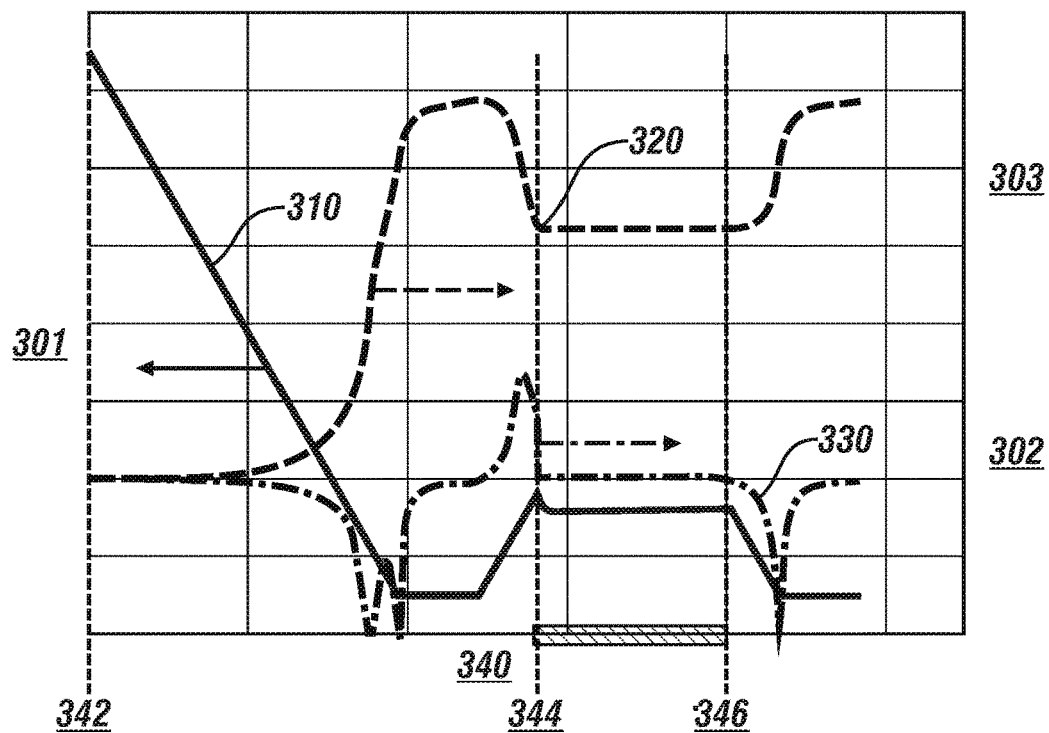
FIG. 3(a) graphically shows voltammetry data associated with a rechargeable battery cell, the data captured at 0.01 mV/s, including voltage holds as well as one 12 hr. period of open circuit, in accordance with the disclosure.
Figure 3B:
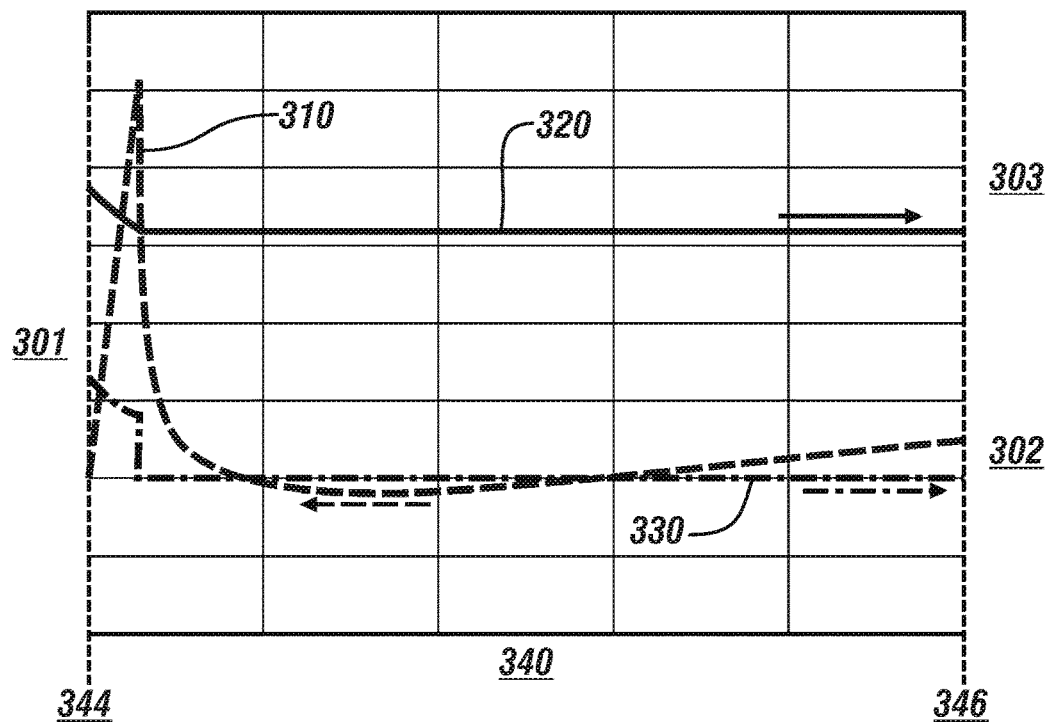
FIG. 3(b) graphically shows data associated with a rechargeable battery cell, the data including a portion of the open circuit period shown with reference to FIG. 3(a) that has been magnified to show the rise in potential starting at about 63 hr., in accordance with the disclosure.

FIGS. 3(a) and 3(b) graphically show data of a similar nature to that shown with reference to FIG. 2, including data plots of cell voltage 310, capacity 320, and current 330 in relation to time 340 during cycling with scales of cell voltage 301, capacity 302, and current 303 indicated on the vertical axes. FIG. 3(a) graphically shows voltammetry data at 0.01 mV/s, including voltage holds as well as a one 12 hr. period of open circuit. FIG. 3(b) graphically shows a portion of the open circuit period that is magnified to show the rise in potential starting at about 63 hr., presumably due to secondary reactions. Beginning at timepoint 342, the cell is cycled from 1.5 V down to 0.1 V at a scan rate of −0.01 mV/s, and this time the voltage is held at 0.1 V for a period of 10 hr. The voltage then scans back up to 371 mV at 0.01 mV/s, at which point a 24 hr. period of open circuit conditions starts, as indicated at timepoint 344. Finally, at timepoint 346 the voltage cycles back down to 0.1 V at −0.01 mV/s and is held at 0.1 V. FIG. 3(b) shows data associated with the region at open circuit that has been magnified; the voltage first decays, but then begins to rise slowly at about 63 hr. The voltage rise after 63 hr. appears to be the result of secondary reactions occurring in the electrolyte. These secondary reactions place a limit on how accurately voltage decay can be measured, and it is thus a challenge to assess where the true equilibrium point of the voltage decay would occur without such reactions, even if the cell stands at open circuit for arbitrarily long times. For the purposes of modeling, in the next section, it is assumed that this equilibrium point would occur midway between the rate-invariant lithiation and delithiation OCV curves:

$$U_{avg}(x) = \frac{U^1(x) + U^0(x)}{2} \quad (1)$$

where x is the State of Charge, U represents voltage, $U^1(x)$ is the rate-invariant delithiation curve and $U^0(x)$ is the rate-invariant lithiation curve. This assumption appears consistent with available data, but it may not be verified to any greater accuracy due to the intrusion of the secondary reactions.

Figure 4A:
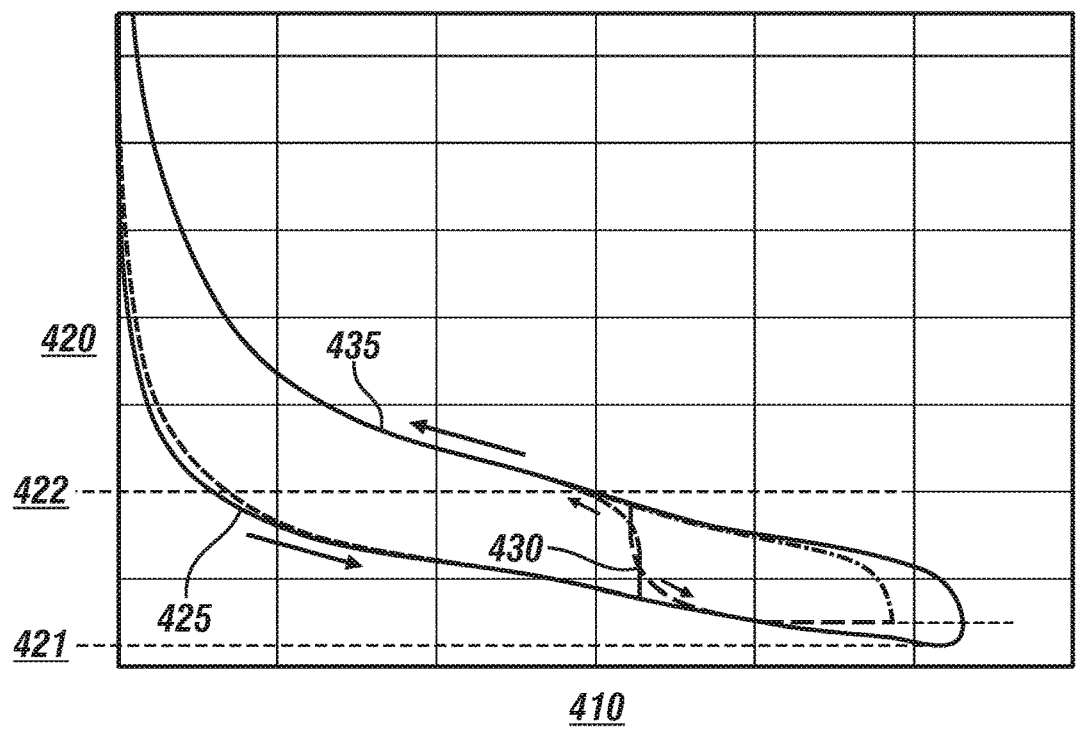
FIG. 4(a) graphically shows data associated with a rechargeable battery cell, the data including plots of voltage vs. capacity corresponding to the data shown in FIGS. 2, 3(a) and 3(b), in accordance with the disclosure.
Figure 4B:
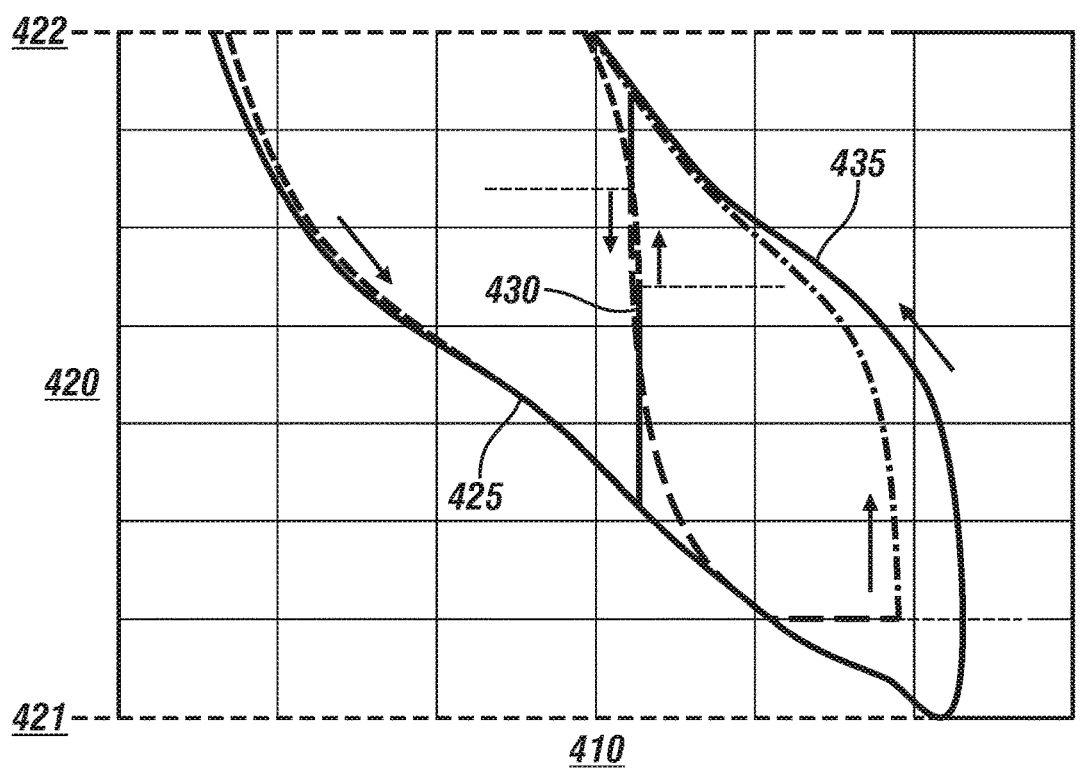
FIG. 4(b) graphically shows data associated with a rechargeable battery cell, the data including a portion of the open circuit periods shown in FIG. 4(a) that has been magnified as well as the voltage holds, in accordance with the disclosure.

FIGS. 4(a) and 4(b) graphically show data plots of cell voltage 420 in relation to capacity 410 during cycling. FIG. 4(a) graphically shows plots of voltage (V) 420 vs. capacity (C) 410 corresponding to the data shown in FIGS. 2, 3(a) and 3(b). After the initial voltage hold at 0.1 V, when scanning at 0.01 mV is resumed, a transitional region, as referred to in the introduction, occurs before the voltage reaches the rate-invariant curve $U^1(x)$ associated with delithiation. When the voltage reaches 371 mV, the current is set to zero, and the voltage then decays to 320 mV. After scanning at −0.01 mV is resumed, a transitional period occurs again, but this time to the rate-invariant lithiation curve $U^0(x)$. FIG. 4(b) graphically shows a portion of the open circuit periods as well as the voltage holds that has been magnified between voltage levels 421 and 422.

Figure 5A:
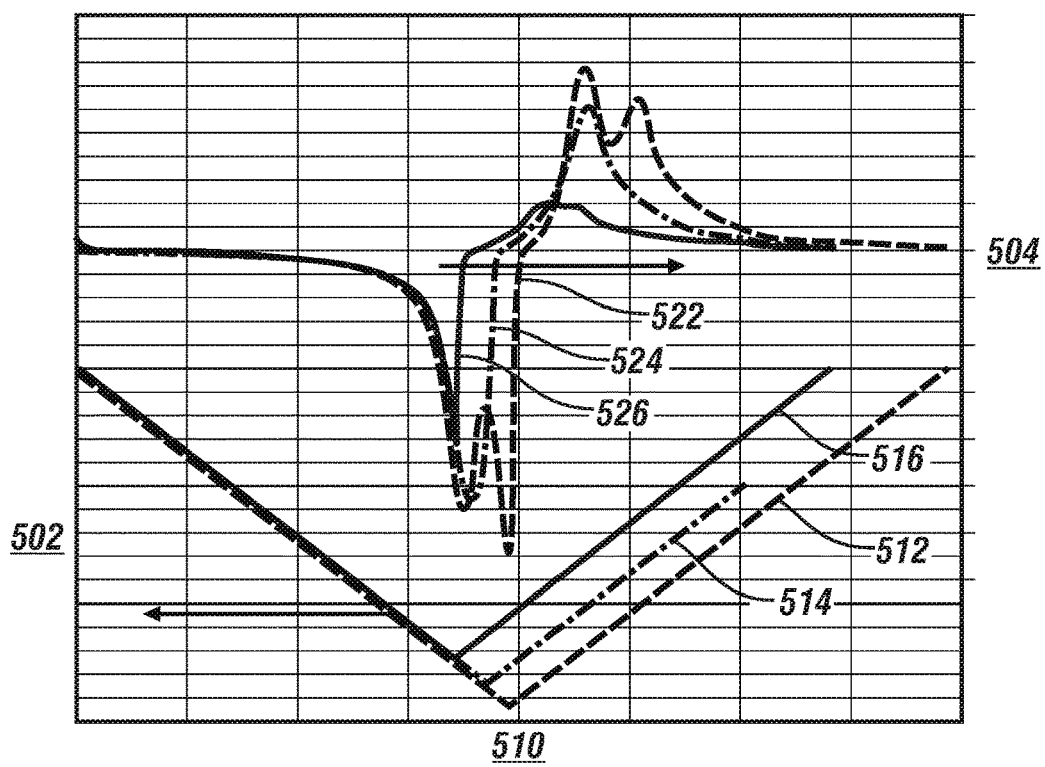
FIG. 5(a) graphically shows data associated with a rechargeable battery cell, the data including voltage and current plotted vs. time for three different cycles, in accordance with the disclosure.
Figure 5B:
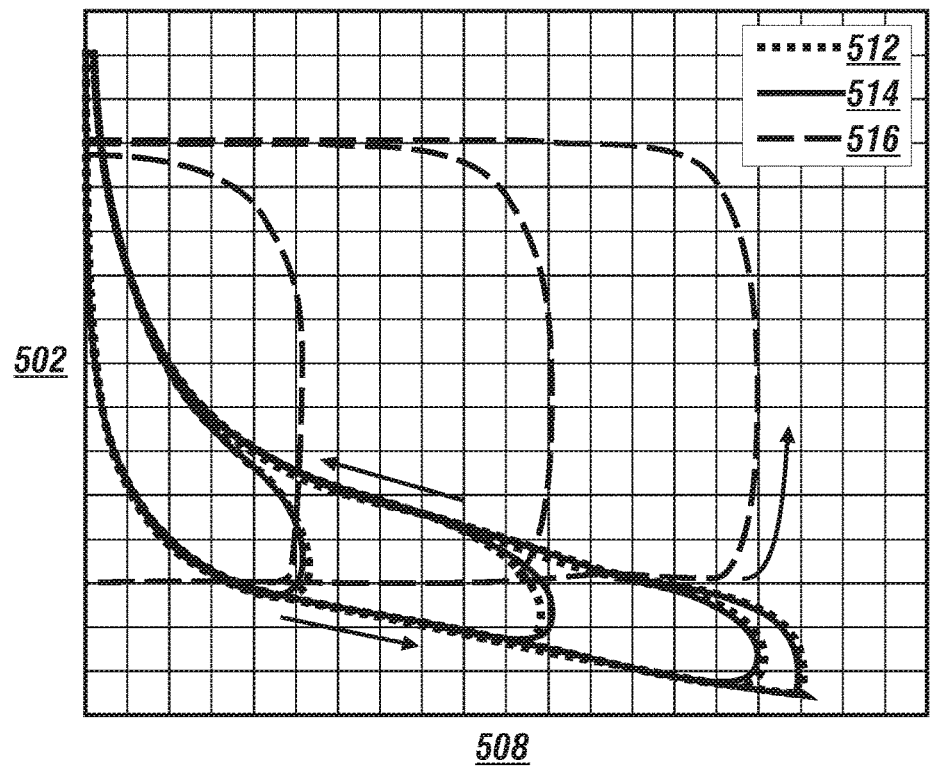
FIG. 5(b) shows data associated with a rechargeable battery cell, the data including the corresponding data plotted as voltage vs. SOC, in accordance with the disclosure.

FIG. 5(a) graphically shows voltages 512, 514, and 516 on V scale 502 and respective currents 522, 524 and 526 on I scale 504 plotted vs. time on T scale 510 for first, second and third cycles respectively. Each cycle starts at 1.5 V vs. Li and lithiates at 0.01 mV/s down to a minimum voltage of 0.267 V for the first cycle, a minimum voltage of 0.16 V for the second cycle, and a minimum voltage of 0.066 V for the third cycle. In each of the three cycles when the minimum voltage is reached, the scan is immediately reversed and continued in the direction of delithiation until the original voltage of 1.5 V is again reached. A voltage hold of 4 hr. separated each cycle. FIG. 5(b) shows the corresponding data plotted as voltage on V scale 502 in relation to SOC on SOC scale 508. Close inspection of FIG. 5(a) shows that there is no discontinuity in the measured currents, even immediately after scan reversal. Instead, there is a brief period where the current climbs steeply from its initial negative values, prior to scan reversal, to the positive values seen on the rate-invariant delithiation curve $U^1$ (x). One consequence of this is that, for a brief time after scan reversal, SOC continues to increase until the current changes sign between a positive value and a negative value. A second consequence is that, during this time, the current passes through the value of zero, where it has already been observed that rate invariance is broken. If rate invariance were to hold for the entire period of time in which the current is negative, then the curves of FIG. 5(b) would stay on the lower voltage curve $U^0$ (x), which they followed prior to scan reversal, but this is not what happens. Instead "overshoots" are shown to occur, in which the SOC continues to increase, even though the voltage is also increasing. This again is an indication of the break-down in rate invariance after scan reversal. The type of overshoots observed after scan reversal in linear voltammetry do not occur when cycling at constant current. In the latter case, there is a discontinuity in the current as it changes sign, and the voltage and current reverse direction simultaneously.

A process associated with rate-invariant modelling is now described. A cycling process can be defined to be rate-invariant if the path taken in the x–U plane, where U is voltage, depends only on the direction followed along the path, but not on the speed with which it is traversed. A large class of rate-invariant processes can be described as functions U(x), where this function may change depending on the sign of $$\frac{dx}{dt},$$

but it does not depend on the magnitude of $$\frac{dx}{dt}.$$

The specification of the range of values of $$\frac{dx}{dt}$$

in which rate invariance holds can be determined.

The primary examples of rate-invariant functions are the lithiating and delithiating OCVs, which are measured at very slow scan rates, either by voltammetry or cycling at slow but constant C-rate as the cell is cycled from no lithium content to full lithiation and back. The measurement of the OCV can start with a cell that has initially equilibrated at constant voltage before the start of scanning in either direction, and it should be noted that the rate invariance of the scan may only occur at some unspecified time after the start of scanning, where this time may be needed to reach a state of dynamic equilibrium. Preferably, a rate-invariant OCV at lithiation and delithiation has been measured and each OCV can be described as a rate-invariant function U(x).

Since the currents passed during linear voltammetry vary from those when cycling at constant C-rate, the fact that the two different processes trace the same OCV curves is an example of rate invariance. The functions $U^0$ (x) can be fitted to the lithiating OCV and $U^1$ (x) to the delithiating OCV. The resulting fitted parameter values are given in Table 1, as follows.

TABLE 1

| Reduction (lithiation) | | | |
|---|---|---|---|
| j | $U_j^{0,\,0}$, V | $X_j^0$ | $\omega_j^0$ |
| 1 | 0.05891 | 0.35734 | 1.1152 |
| 2 | 0.22244 | 0.23758 | 1.1691 |
| 3 | 0.22973 | 0.27370 | 2.9958 |
| 4 | 0.41303 | 0.13137 | 6.8045 |

| Oxidation (de-lithiation) | | | |
|---|---|---|---|
| j | $U_j^{0,\,1}$, V | $X_j^0$ | $\omega_j^1$ |
| 1 | 0.30192 | 0.33091 | 1.4090 |
| 2 | 0.48107 | 0.27766 | 1.7049 |
| 3 | 0.65302 | 0.12181 | 2.7764 |
| 4 | 0.96132 | 0.11916 | 7.6463 |

$$x_j = \frac{X_j^i}{1 + \exp[f(U^i - U_j^{0,i})/\omega_j^i]}; \; 0 < x_j < X_j^i$$

$$x(U^i) = \sum_j x_j \text{ and } 0 < x(U^i) < \Sigma_j X_j^i$$

Parameters are used to represent the functions $U^0$ (x) and $U^1$ (x). The formulas given above describe the inverse functions x ($U^0$) and x ($U^1$); these functions must then be numerically inverted to obtain the functions $U^i$ (x), i=0.1.

The modeling describes the transitional regions between these two curves, which occur when the current or voltage scan rate changes direction.

The definition of $U_{avg}$ (x) given in the last section can be augmented with the additional defined variables $U_{max}$ (x) and $\varsigma$:

$$U_{avg}(x) = \frac{U^1(x) + U^0(x)}{2}, \; U_{max}(x) = \frac{U^1(x) - U^0(x)}{2} \quad (2)$$

$$u = U_{avg}(x) + U_{max}(x)\varsigma, \; -1 \leq \varsigma \leq 1$$

The term $\varsigma$ is a dimensionless stress term that saturates at ±1, when the potential U is on either the delithiation $U^1$ (x) or lithiation $U^0$ (x) rate-invariant branch.

When $\varsigma = -1$, the path $U^0$ (x) is traversed and when $\varsigma = 1$, the path $U^1$ (x) is traversed; for intermediate values of $\varsigma$, the voltage U lies somewhere between the upper and lower voltage curves, $U^1$ (x) and $U^0$ (x).

To proceed further, the function can be defined as follows.

$$\text{sign}(y) = \begin{cases} 1 & \text{when } y > 0 \\ -1 & \text{when } y < 0 \\ \text{indeterminate} & \text{when } y = 0 \end{cases} \quad (3)$$

Note that this function can be defined so that sign (0)=0, but the above definition satisfies the following Equation:

$$\text{sign}(y) = \lim_{\alpha \to \infty} \tanh(\alpha y) \quad (4)$$

The starting point is the rate-invariant model, as follows:

$$\frac{d\varsigma}{dx} = -K\left(1 + \text{sign}\left(\frac{dx}{dt}\right)\varsigma\right) \quad (5)$$

The constant K is positive, so that when $$\frac{dx}{dt} > 0$$

(lithiation, reduction), solutions to Equations (2) and (5) tend to the value $\varsigma = -1$ and $U = U^0(x)$, whereas when $$\frac{dx}{dt} < 0$$

(delithiation, oxidation), they tend to the value $\varsigma = 1$ and $U = U^1(x)$ Equation (5) can be rewritten as a differential equation in time as follows:

$$\begin{aligned}\frac{d\varsigma}{dt} &= \frac{d\varsigma}{dx}\frac{dx}{dt} \\ &= -K\frac{dx}{dt}\left(1 + \text{sign}\left(\frac{dx}{dt}\right)\varsigma\right) \\ &= -K\left|\frac{dx}{dt}\right|\left(\text{sign}\left(\frac{dx}{dt}\right) + \varsigma\right)\end{aligned} \quad (6)$$

The rate-invariant model includes Equations (2) and (6), or equivalently Equations (2) and (5).

It turns out that the derivatives $$\frac{dU}{dt} \text{ and } \frac{dx}{dt}$$

always have opposite signs during rate-invariant cycling. To see this, note that from Equations (2) and (5)

$$\frac{dU}{dt} = \left(\frac{\partial U}{\partial x} + U_{max}\frac{d\varsigma}{dx}\right)\frac{dx}{dt}, \frac{\partial U}{\partial x} = \frac{\partial}{\partial x}(U_{avg}(x) + U_{max}(x)\varsigma) \quad (7)$$

-continued $$\frac{\left(\frac{\partial U}{\partial t}\right)}{\left(\frac{dx}{dt}\right)} = \frac{\partial U}{\partial x} + U_{max}\frac{d\varsigma}{dx} = \frac{\partial U}{\partial x} - U_{max}K\left(1 + \text{sign}\left(\frac{dx}{dt}\right)\varsigma\right) < 0$$

The inequality above holds because the function $$\frac{dU}{dx}$$

always has negative values and $U_{max}$ and K are both positive. Equation (7) implies that during rate-invariant cycling, the following relationship is invoked:

$$\text{sign}\left(\frac{dx}{dt}\right) = -\text{sign}\left(\frac{dU}{dt}\right). \quad (8)$$

The breakdown of rate invariance can be described as follows. The data show that rate invariance must break down at some low value of $$\frac{dx}{dt}.$$

This can be seen from linear voltammetry plots, which exhibit "overshoots" during scan reversal. The overshoot means that $$\frac{dx}{dt}$$

remains positive for a short time after scan reversal, when $$\frac{dU}{dt}$$

becomes positive, and this violates Equation (8). When moving along the lower voltage curve $U^0(x)$, rate-invariance implies that one must stay on the lower voltage curve as long as $$\frac{dx}{dt} > 0,$$

but during the overshoot the voltage leaves the lower voltage curve.

Figure 6:
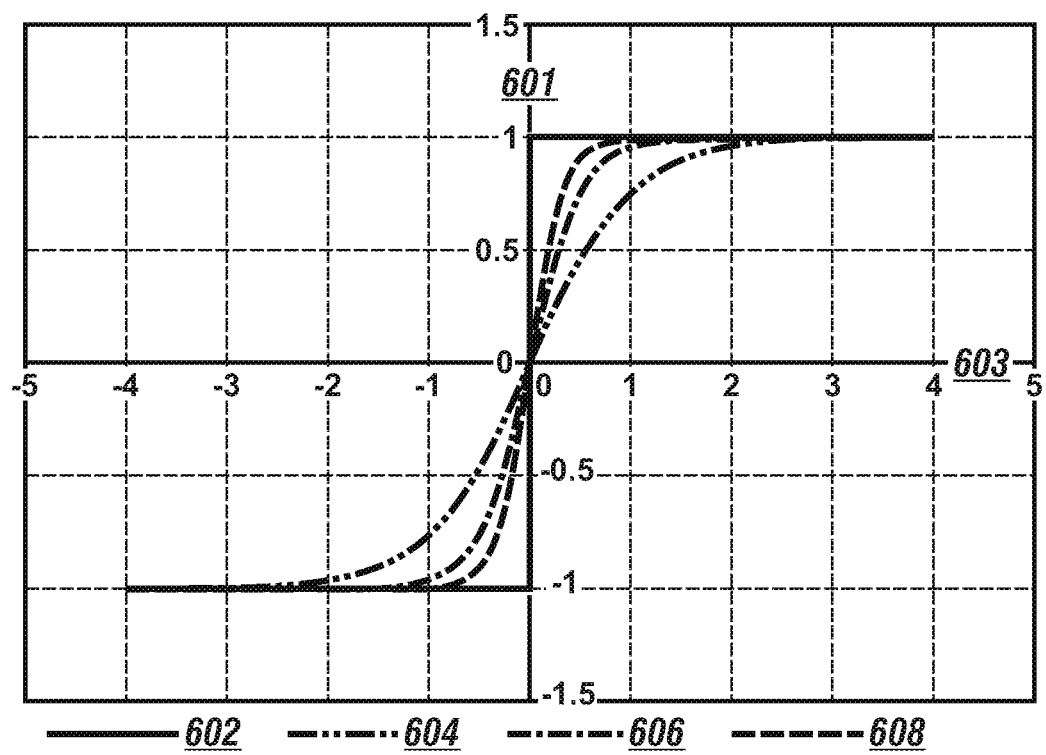
FIG. 6 graphically shows a comparison of the functions sign(y) and tan h($\alpha$y), in accordance with the disclosure.

The breakdown of rate invariance into Equation (6) can be incorporated in two different ways. First, the function sign $$\left(\frac{dx}{dt}\right)$$

is replaced with the function tan h $$\left(\frac{\alpha}{x}\frac{dx}{dt}\right),$$

where the value of $\alpha$ must be chosen to be consistent with measured data. The model now has two independent parameters, K (which is dimensionless) and $\alpha$ (with dimension of time). FIG. 6 graphically shows a comparison of the functions sign(y) 602, which is indicated on axis 601 and tan h($\alpha$y), which is indicated on axis 603 and includes tan h (y) 604, tan h(y) 606 and tan h(y) 608; it is clear that, as $\alpha$ becomes large, the two functions approach each other, in accordance with Equation (4) above. The form $$\frac{\alpha}{x}\frac{dx}{dt},$$

which shows up as the argument of the tan h function, recognizes the fact that the OCVs have a logarithmic singularity as x→0. Thus, linear voltage scans at very small values of x exhibit a much smaller value of $$\frac{dx}{dt}$$

than the same voltage scan exhibits at larger values of x, and the tan h argument $$\frac{\alpha}{x}\frac{dx}{dt}$$

comes closer to maintaining the same magnitude at both large and small values x because of the factor 1/x. With this modification, the following relations are employed:

$$\left|\tanh\left(\frac{\alpha}{x}\frac{dx}{dt}\right)\right| = 1 \text{ implies rate invariance} \quad (9)$$

$$\left|\tanh\left(\frac{\alpha}{x}\frac{dx}{dt}\right)\right| < 1 \text{ implies rate dependence}$$

The value of the tan h function never really reaches one in absolute value; it only approaches one for sufficiently large values of $$\frac{\alpha}{x}\frac{dx}{dt}.$$

It is thus convenient to choose a somewhat arbitrary threshold as a boundary for rate invariance. As such Equation (9) can be modified to the following form:

$$\left|\tanh\left(\frac{\alpha}{x}\frac{dx}{dt}\right)\right| \geq 0.97 \text{ implies rate invariance} \quad (10)$$

$$\left|\tanh\left(\frac{\alpha}{x}\frac{dx}{dt}\right)\right| < 0.97 \text{ implies rate dependence}$$

The value of the fitting factor $\alpha$ can be selected in order to determine the threshold of rate invariance, wherein large values of $\alpha$ lead to rate invariance at small values of $$\frac{dx}{dt}$$

and, as the fitting factor $\alpha$ decreases, the breakdown of rate invariance increases to higher values of $$\frac{dx}{dt}.$$

The second change to Equation (6) is to place a lower limit on the factor $$\left|\frac{dx}{dt}\right|$$

which appears on the right hand side. The modified version of Equation (6) now becomes as follows:

$$\frac{d\varsigma}{dt} = -k\left(\tanh\left(\frac{\alpha}{x}\frac{dx}{dt}\right) + \varsigma\right) \quad (11)$$

Where $$k = \begin{cases} K\left|\frac{dx}{dt}\right| \text{ for } \left|\frac{dx}{dt}\right| \geq \chi \\ K\chi \text{ for } \left|\frac{dx}{dt}\right| < \chi \end{cases} \text{ where } \tanh\left(\frac{\alpha}{x}\chi\right) = 0.97, \text{ and } \chi = \frac{x}{\alpha}2.092\ldots \quad (12)$$

Figure 7:
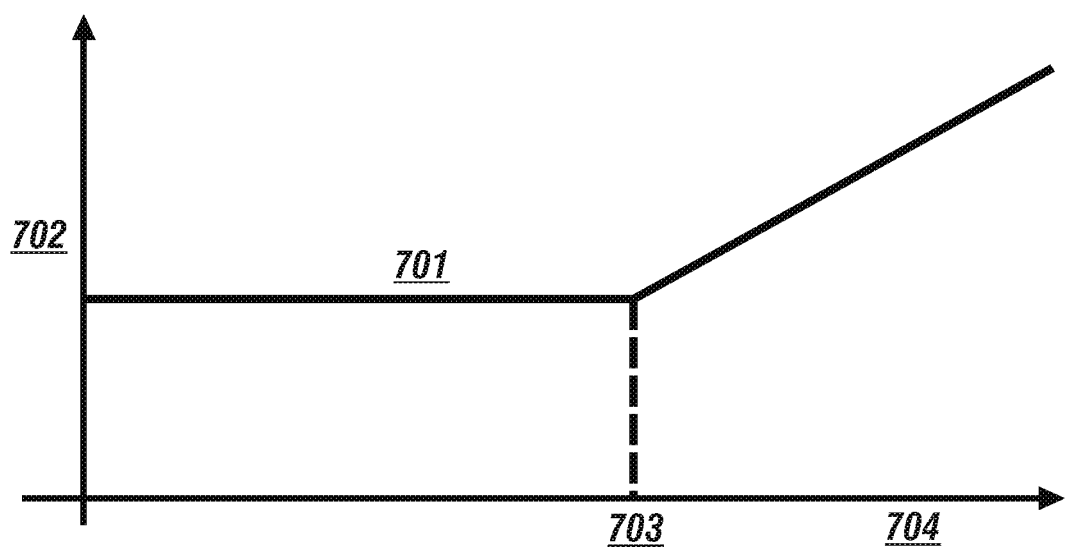
FIG. 7 shows a schematic plot of the rate constant k as a function of $$\left|\frac{dx}{dt}\right|,$$

In summary, Equations (11) and (12) closely approximate Equation (6) when $$\left|\frac{dx}{dt}\right| \geq \chi$$

because tan h $$\left(\frac{\alpha}{x}\frac{dx}{dt}\right) \approx \text{sign}\left(\frac{dx}{dt}\right),$$

and in this region rate invariance holds, but Equation (6) becomes rate dependent for $$\left|\frac{dx}{dt}\right| < \chi,$$

consistent with Equations (10) and (12). FIG. 7 shows a schematic plot of the rate constant k 701, which is indicated on the rate constant axis 702 as a function of $\left|\frac{dx}{dt}\right|$, which is indicated on axis 704. The boundary of $$\left|\frac{dx}{dt}\right| = \chi$$

is indicated at point 703.

The modifications in Equation (11) in order to break rate invariance are not entirely arbitrary. The rate-invariant form of Equation (11) may not hold down to arbitrarily small values of $$\left|\frac{dx}{dt}\right|,$$

because this would predict that $\varsigma$, and hence U, does not decay when the cell is held at open circuit. In contrast to this, FIG. 2 shows a voltage decay at open circuit. It follows that the coefficient $$K\left|\frac{dx}{dt}\right|$$

appearing in Equation (12) must be replaced with a nonzero value at zero current. In the rate-dependent form of Equation (12), the rate constant $k=K\chi$ is constant in the entire region of rate dependence.

The function $$\chi = \frac{x}{\alpha} 2.092\ldots$$

represents the boundary $$\left|\frac{dx}{dt}\right| = \chi$$

between rate-invariant and rate-dependent behavior, and this boundary is the same, independent of the sign of $$\frac{dx}{dt}.$$

However, during linear voltammetry, when $$\frac{dU}{dt}$$

is specified, the boundary between rate-invariant and rate-dependent behavior in terms of $$\frac{dU}{dt}$$

now becomes direction dependent. For example, suppose the cell is lithiating in a rate-invariant fashion and following the lower voltage curve, wherein $\varsigma = -1$. Then, differentiating Equation (2) leads to the following bound on rate invariance:

$$\frac{dU}{dt} = \frac{\partial U}{\partial x}\chi - K\chi\left(\tanh\left(\frac{\alpha}{x}\chi\right) + \varsigma\right) \quad (13)$$

$$= \frac{dU^0}{dx}\chi - K\chi(0.03)$$

$$\left|\frac{dU}{dt}\right| = \left|\frac{dU^0}{dx} - 0.03K\right|\chi \text{ for } \frac{dU}{dt} < 0$$

When the scan reverses, however, the bound in terms of $$\frac{dx}{dt}$$

changes from $\chi$ to $-\chi$ and $$\frac{dU}{dt} = \frac{\partial U}{\partial x}\chi - K|\chi|\left(\tanh\left(-\frac{\alpha}{x}\chi\right) + \varsigma\right) \quad (14)$$

$$= \frac{dU^0}{dx}\chi - K\chi(1.97)$$

$$\left|\frac{dU}{dt}\right| = \left|\frac{dU^0}{dx} - 1.97K\right|\chi \text{ when } \frac{dU}{dt} > 0$$

and this is the boundary in the delithiating direction. From this it follows that a voltage scan reversal under these circumstances can lead to rate-dependent behavior, even though it was rate-invariant up until the scan reversal. This fact is critical in understanding the overshoots observed during voltammetry at scan reversal. Numerical solutions to Equations (2) and (11) also illustrate overshoots at scan reversal during voltammetry.

Equations (2) and (11) must be solved for either voltage or current cycling. When cycling current, $$\frac{dx}{dt}$$

is known and it is straightforward to insert this value into Equation (11) to determine $$\frac{d\varsigma}{dt}.$$

The time derivative of Equation (2) then yields as follows:

$$\frac{dU}{dt} = \frac{\partial U}{\partial x}\frac{dx}{dt} + U_{max}\frac{d\varsigma}{dt} \quad (15)$$

Equation (15) then determines the voltage derivative. Conversely, in voltammetry the derivative is known and the derivative $$\frac{dx}{dt}$$

must be determined. It can be shown that solutions for $$\frac{dx}{dt},$$

given $$\frac{dU}{dt},$$

based on Equations (2) and (11), exist and are unique. They can be numerically solved by solving Equation (11) for $$\frac{dx}{dt}$$

using the first of Equations (12). If the answer is greater or equal to y in magnitude, then this is the desired solution. Otherwise, the second of Equations (12) must be used to solve for $$\frac{dx}{dt}.$$

This answer will then be less than y in magnitude and is the desired answer.

Model simulations were conducted, which included fitting of model parameters to data, which requires values not only for K and a but also for lithiating and delithiating OCVs, $U^0$ (x) and $U^1$ (x). These curves vary somewhat from cell build to cell build, and it is important to do the fitting based on data from the same cell. As noted previously, the methods used to fit $U^0$ (x) and $U^1$ (x) and the fit values for the data presented in this section are given in Table 1. FIG. 8 shows a model comparison to the same data shown in FIG. 2, using values α=30 hr and K=25.

The data plots of cell voltage 210, capacity 220, and current 230 are shown in relation to time 240, and corresponding modelled cell voltage 810, modelled capacity 820, and modelled current 230. The assumption for the model simulation is that $\varsigma$ =−1 and $U^0$ (x)=1.5 at the start of the scan. After the scan starts, $\varsigma$ follows the lithiating OCV curve until the start of the 24 hours open circuit period. After the open circuit period ends, $\varsigma$ has decayed to a value very close to zero, and it needs some time to reach its maximum value, at which point the curve follows the delithiating OCV. The actual decay at open circuit is only approximately followed by the model, because the simplest linear decay law was used in the rate-dependent form of Equation (11).

FIG. 9 shows model simulations of a current cycle at C/40 910 and linear voltammetry 920 at 0.01 mV/s, plotted as potential U on the vertical axis 902 in relation to a fraction of maximum SOC on the horizontal axis 904, using the same values α=30 hr. and K=25 as in FIG. 8. Each cycle starts at 1.5 V and decreases to a state of charge of about x=0.79, then reverses. Most of the two scans are identical and follow the rate-invariant paths $U^0$ (x) and $U^1$ (x); the only differences are in the transitional region after scan reversal, where an overshoot is seen in the voltammetry, but none is seen in the C/40 scan.

The values for K and a matter most in model simulations of the transitional region. These values likely do not remain the same for scan reversals at different SOCs. FIG. 5(b) compares model simulations with the data for the three different scans shown. The scan reversals occur at the voltages 0.066, 0.16, and 0.267 V. To allow the values for K and α to be different for each of these cases, polynomial expressions for both α and K as functions of x and $\varsigma$ were used, of the form:

$$\alpha = \sum_{i=0}^{3}\left(\sum_{j=0}^{3}\alpha_{ij}(1+\varsigma)^j\right)x^i \qquad (16)$$

$$K = \sum_{i=0}^{3}\left(\sum_{j=0}^{3}K_{ij}(1+\varsigma)^j\right)x^i$$

and the matrix of values $\alpha_{ij}$ and $K_{ij}$ were fit to the data in FIG. 5(b). Table 2 gives the coefficients that were fit for these polynomial expressions in one embodiment.

Thin silicon films were cycled at 0.01 mV/s, and the behavior of the relationship between voltage U and State of Charge (SOC) x was studied under cycling, during voltage holds or open circuit conditions, and immediately after scan reversal. At these very low scan rates, the voltage as a function of SOC follows different paths in the x–U plane depending on whether the cell is lithiating or delithiating, but there is a region of rate invariance so that, for example, cycling at C/40 constant current follows the same path in the x–U plane that is followed during linear voltammetry at 0.01 mV/s, even though the currents at C/40 are different from those exhibited during linear voltammetry. The simulations shown in FIG. 9 illustrate that rate invariance breaks down in the transitional region just after scan reversal, when the path followed during voltammetry is different from that followed when cycling at constant current. In addition, as shown in FIGS. 2 through 4, it is observed that at open circuit the voltage decays, and during voltage holds the SOC exhibits a transient decay to an apparent steady state as well, although it may be a challenge to precisely determine what these steady state conditions are due to apparent secondary reactions occurring in the electrolyte. It can be inferred that the rate invariance during cycling only occurs over a fixed range of currents; at larger currents, or faster cycling rates, irreversible processes attributable to diffusion or kinetic effects become noticeable, whereas at smaller currents transient effects occur. The transients associated with very low currents may be related to slow stress-relaxation and creep phenomena of the active material. The latter effects are difficult to study, because they are occurring at cycling rates below what is achievable with available measurement equipment. FIG. 1 summarizes the different types of behaviors that occur in thin films of silicon at different scan rates.

As described herein, an empirical approach can be applied to model the data, starting with a simple model of rate-invariant behavior. Given any starting point in the x–U plane, the model Equations (2) and (5) predict the path U(x) that is followed, depending only on the direction of current but not on its magnitude. When the cell is lithiating, all such paths tend to a single rate-invariant path of lithiation $U^0$ (x), and the path followed during delithiation always tends to a single rate-invariant delithiation path $U^1$ (x).

At smaller currents, outside the region of rate invariance, the equations are modified as given in Equations (2) and (11). Because direct measurements at cycling rates below rate invariance are not readily achievable, Equation (5) to Equation (11) can be generalized. In particular, Equation (11) can reproduce qualitatively the voltage decay at open circuit, which is not predicted by the rate-invariant analogue that is described in Equation (5).

FIG. 5 shows that the current reverses sometime after voltage reversal when cycling at 0.01 mV/s, creating overshoots that are visible in the x–U plane. This behavior violates rate invariance, and Equation (11) predicts such behavior when the model parameters satisfy certain inequalities. The simulations shown in FIG. 5 illustrate this behavior. For both the voltage 514 associated with the model and the voltage 512 associated with the experiment, when cycling at constant current, these overshoots are not seen.

Equation (11) predicts that overshoots after scan reversal should become smaller as the scan rate increases, and, at high enough scan rates, the overshoots should disappear entirely. Such results may be obscured by the impact of interfacial (charge-transfer) kinetics and solid-phase diffusion resistance before they become observable, but it is hoped that smaller overshoots at higher scan rates can still be observed in the region of rate invariance, before the above effects become noticeable.

The hysteretic relationship between the potential U or OCV, which can be dynamically measured, and a battery state, such as SOC, can be characterized, as shown with reference to FIGS. 4(a) and 4(b). This includes executing a slow but finite-rate voltage scan (e.g., −0.01 mV/s) of an example cell to determine a state of dynamic equilibrium that is reached in which the voltage follows the reduction branch of the OCV vs. SOC curves, which is associated with lithiation or charging. An example of such a result is shown as line segment 435 with reference to FIG. 4(b). Behavior along this path is rate-invariant. When the scan is reversed, a state of dynamic equilibrium is eventually reached in which the voltage follows the oxidation branch of the OCV vs. SOC curves, which is associated with delithiation or discharging. An example of such a result is shown as line segment 425 with reference to FIG. 4(b). Behavior along this path is again rate-invariant. Just after voltage-scan reversal, a transitional, rate-dependent period occurs in which the voltage moves between the reduction and oxidation branches described above. An example of such a result is shown as line segment 430 with reference to FIG. 4(a).

The characterization of the hysteretic relationship between the potential U or OCV and the battery state of SOC, can be expressed as a relationship in the form of a solvable mathematical expression, e.g., Equation (2), above, and repeated herein:

$$U_{avg}(x) = \frac{U^1(x) + U^0(x)}{2}, U_{max}(x) = \frac{U^1(x) - U^0(x)}{2} \quad (17)$$

$$U = U_{avg}(x) + U_{max}(x)\varsigma, \ -1 \le \varsigma \le 1$$

When $\varsigma = -1$, the path $U^0$ (x) is traversed and when $\varsigma = 1$, the path $U^1$ (x) is traversed; for intermediate values of $\varsigma$, the voltage U lies somewhere between the upper and lower voltage curves, $U^1$ (x) and $U^0$ (x).

The voltage U, which reflects the desired OCV value, can be used to determine the SOC. The expression of Equation (2) is in the form of an ordinary differential Equation, which can be reduced to algorithmic code and dynamically solved to determine the value of $\varsigma$, employing a numerical method, such as an Euler method, a Runge-Kutta method, a linear multistep method, or another suitable method. When the value of $\varsigma$ is determined, the value for $U_{avg}$ (x) and the other terms can be determined, thus leading to determining the voltage U, which can be used to determine the SOC. The concepts described herein can be reduced to practice as algorithmic code and calibrations that are stored in non-volatile memory and executed in a controller to determine various parameters that can be associated with operating states of a battery that employs lithium.

The concepts described herein can be applied to any hysteresis model, applied to any material, which is consistent with a classification scheme that is described as follows. During a slow but finite-rate voltage scan (e.g., −0.01 mV/s) a state of dynamic equilibrium is reached in which the voltage follows the reduction branch of the OCV vs. SOC curves. Behavior along this path is rate-invariant. When the scan is reversed, a state of dynamic equilibrium is eventually reached in which the voltage follows the oxidation branch of the OCV vs. SOC curves. Behavior along this path is again rate-invariant. Just after voltage-scan reversal, a transitional, rate-dependent period occurs in which the voltage moves between the reduction and oxidation branches, as described above.

The term "controller" and related terms such as control module, module, control, control unit, processor and similar terms refer to one or various combinations of Application Specific Integrated Circuit(s) (ASIC), electronic circuit(s), central processing unit(s), e.g., microprocessor(s) and associated non-transitory memory component(s) in the form of memory and storage devices (read only, programmable read only, random access, hard drive, etc.). The non-transitory memory component is capable of storing machine readable instructions in the form of one or more software or firmware programs or routines, combinational logic circuit(s), input/output circuit(s) and devices, signal conditioning and buffer circuitry and other components that can be accessed by one or more processors to provide a described functionality. Input/output circuit(s) and devices include analog/digital converters and related devices that monitor inputs from sensors, with such inputs monitored at a preset sampling frequency or in response to a triggering event. Software, firmware, programs, instructions, control routines, code, algorithms and similar terms mean controller-executable instruction sets including calibrations and look-up tables. Each controller executes control routine(s) to provide desired functions. Routines may be executed at regular intervals, for example each 100 microseconds during ongoing operation. Alternatively, routines may be executed in response to occurrence of a triggering event. Communication between controllers, and communication between controllers, actuators and/or sensors may be accomplished using a direct wired point-to-point link, a networked communication bus link, a wireless link or another suitable communication link. Communication includes exchanging data signals in suitable form, including, for example, electrical signals via a conductive medium, electromagnetic signals via air, optical signals via optical waveguides, and the like.

The data signals may include discrete, analog or digitized analog signals representing inputs from sensors, actuator commands, and communication between controllers. The term "signal" refers to a physically discernible indicator that conveys information, and may be a suitable waveform (e.g., electrical, optical, magnetic, mechanical or electromagnetic), such as DC, AC, sinusoidal-wave, triangular-wave, square-wave, vibration, and the like, that is capable of traveling through a medium.

The term 'model' refers to a processor-based or processor-executable code and associated calibration that simulates a physical existence of a device or a physical process. As used herein, the terms 'dynamic' and 'dynamically' describe steps or processes that are executed in real-time and are characterized by monitoring or otherwise determining states of parameters and regularly or periodically updating the states of the parameters during execution of a routine or between iterations of execution of the routine. The terms "calibration", "calibrate", and related terms refer to a result or a process that compares an actual or standard measurement associated with a device with a perceived or observed measurement or a commanded position. A calibration as described herein can be reduced to a storable parametric table, a plurality of executable Equations or another suitable form. A parameter is defined as a measurable quantity that represents a physical property of a device or other element that is discernible using one or more sensors and/or a physical model. A parameter can have a discrete value, e.g., either "1" or "0", or can be infinitely variable in value.

The equations can be reduced to executable algorithmic code that may be implemented by special purpose hardware-based systems that perform the specified functions or acts, or combinations of special purpose hardware and computer instructions. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks. Furthermore, the present disclosure may take the form of a computer program product embodied in a tangible medium of expression having computer-usable program code embodied in the medium.

The detailed description and the drawings are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims.

The invention claimed is:

1. A method for charging a battery cell of a DC power device, wherein the battery cell includes an electrode, the method comprising:
    determining a rate-invariant charge/discharge relationship between an open-circuit voltage (OCV) and a state of charge (SOC) for the battery cell, including:
        executing a first finite-rate voltage scan associated with a first state of dynamic equilibrium in which a scanned voltage follows a reduction branch of a relationship between the OCV and the SOC, and
        executing a second finite-rate voltage scan associated with a second state of dynamic equilibrium in which the scanned voltage follows an oxidation branch of the relationship between the OCV and the SOC;
    determining a rate-dependent charge/discharge relationship between the OCV and the SOC for the battery cell during a period in which the scanned voltage transitions between the reduction branch and the oxidation branch;
    dynamically determining an electrical potential for the battery cell;
    dynamically determining, via a controller, a present SOC state for the battery cell based upon the electrical potential for the battery cell, the rate-invariant charge/discharge relationship between the OCV and the SOC for the battery cell, and the rate-dependent charge/discharge relationship between the OCV and the SOC for the battery cell during a voltage-scan reversal that occurs when the scanned voltage transitions between the reduction and oxidation branches; and
    controlling, via the controller, charging of the battery cell based upon the present SOC state for the battery cell.

2. The method of claim 1, further comprising determining the electrical potential for the battery cell (U) in relation to the SOC for the battery cell (x) in accordance with the relationship:

$$U = U_{avg}(x) + U_{max}(x)\varsigma, \quad -1 \leq \varsigma \leq 1$$

$$U_{avg}(x) = \frac{U^1(x) + U^0(x)}{2}, \quad U_{max}(x) = \frac{U^1(x) - U^0(x)}{2};$$

wherein the rate-dependent charge/discharge relationship between the OCV and the SOC for the battery cell during the voltage-scan reversal is determined in accordance with the relationship:

$$\left|\tanh\left(\frac{\alpha}{x}\frac{dx}{dt}\right)\right| < 0.97$$

and, wherein the rate-invariant charge/discharge relationship between the OCV and the SOC for the battery cell during the voltage-scan reversal is determined in accordance with the relationship:

$$\left|\tanh\left(\frac{\alpha}{x}\frac{dx}{dt}\right)\right| \geq 0.97$$

wherein:
    α represents a fitting factor in relation to a stress function $\varsigma$,
    x represents the SOC, and
    t represents time.

3. The method of claim 2, further comprising indicating a change in the stress function $\varsigma$ in relation to time in accordance with the relationship:

$$\frac{d\varsigma}{dt} = -k\left(\tanh\left(\frac{\alpha}{x}\frac{dx}{dt}\right) + \varsigma\right)$$

and $$k = \begin{cases} K\left|\frac{dx}{dt}\right| \text{ or } \left|\frac{dx}{dt}\right| \geq \chi \\ K\chi \text{ for } \left|\frac{dx}{dt}\right| < \chi \end{cases} \text{ where } \tanh\left(\frac{\alpha}{x}\chi\right) = 0.97, \text{ and } \chi = \frac{x}{\alpha}2.092\ldots$$

wherein:
K is a constant,
χ represents a boundary between rate-invariant and rate-dependent behavior, and
ς represents stress.

4. The method of claim 1, wherein the rate-invariant charge/discharge relationship includes a hysteretic relationship between the OCV and the SOC.

5. The method of claim 1, wherein determining the rate-invariant charge/discharge relationship between the OCV and the SOC for the battery cell further comprises:
determining a mathematical expression for the rate-invariant charge/discharge relationship between the OCV and SOC for the battery cell; and
generating executable algorithmic code representing the mathematical expression for the rate-invariant charge/discharge relationship between the OCV and SOC for the battery cell.

6. The method of claim 5, wherein the mathematical expression for the rate-invariant charge/discharge relationship between the OCV and SOC for the battery cell comprises an ordinary differential equation; and wherein generating executable algorithmic code representing the mathematical expression for the rate-invariant charge/discharge relationship between the OCV and SOC for the battery cell comprises executing, via the controller, a numerical method to determine a numerical solution to the ordinary differential equation.

7. The method of claim 1, wherein the first finite-rate voltage scan comprises a rate-invariant scan.

8. The method of claim 7, wherein the first finite-rate voltage scan comprises a rate of −0.01 mV/s.

9. The method of claim 1, wherein the second finite-rate voltage scan comprises a rate-invariant scan.

10. The method of claim 9, wherein the second finite-rate voltage scan comprises a rate of 0.01 mV/s.

11. The method of claim 1, wherein the second finite-rate voltage scan associated with the state of dynamic equilibrium in which the scanned voltage follows the oxidation branch of the relationship between the OCV and the SOC is associated with lithiation of the electrode of the battery cell.

12. The method of claim 1, wherein the first finite-rate voltage scan associated with the state of dynamic equilibrium in which the scanned voltage follows the reduction branch of the relationship between the OCV and the SOC is associated with delithiation of the electrode of the battery cell.

13. A method for determining a state of charge for a battery cell of a DC power device, wherein the battery cell includes a lithiated electrode, the method comprising:
determining a rate-invariant charge/discharge relationship between an open-circuit voltage (OCV) and a state of charge (SOC) for the battery cell, including:
executing a first finite-rate voltage scan associated with a first state of dynamic equilibrium in which a scanned voltage follows a reduction branch of a relationship between the OCV and the SOC, and
executing a second finite-rate voltage scan associated with a second state of dynamic equilibrium in which the scanned voltage follows an oxidation branch of the relationship between the OCV and the SOC;
determining a rate-dependent charge/discharge relationship between the OCV and the SOC for the battery cell during a period in which the scanned voltage transitions between the reduction branch and the oxidation branch;
dynamically determining an electrical potential for the battery cell; and
dynamically determining, via a controller, a present SOC state for the battery cell based upon the electrical potential for the battery cell, the rate-invariant charge/discharge relationship between the OCV and the SOC for the battery cell, and the rate-dependent charge/discharge relationship between the OCV and the SOC for the battery cell.

14. The method of claim 13, further comprising indicating the electrical potential for the battery cell (U) in relation to the SOC for the battery cell (x) in accordance with the relationship:

$$U = U_{avg}(x) + U_{max}(x)\varsigma, \; -1 \leq \varsigma \leq 1$$

$$U_{avg}(x) = \frac{U^1(x) + U^0(x)}{2}, \; U_{max}(x) = \frac{U^1(x) - U^0(x)}{2};$$

wherein the rate-dependent charge/discharge relationship between the OCV and the SOC for the battery cell is determined in accordance with the relationship:

$$\left| \tanh\left(\frac{\alpha}{x}\frac{dx}{dt}\right) \right| < 0.97$$

and,
wherein the rate-invariant charge/discharge relationship between the OCV and the SOC for the battery cell is determined in accordance with the relationship:

$$\left| \tanh\left(\frac{\alpha}{x}\frac{dx}{dt}\right) \right| \geq 0.97$$

wherein:
α represents a fitting factor in relation to a stress function ς,
x represents the SOC, and
t represents time.

15. The method of claim 14, further comprising defining a change in the stress function ς in relation to time being indicated in accordance with the relationship:

$$\frac{d\varsigma}{dt} = -k\left(\tanh\left(\frac{\alpha}{x}\frac{dx}{dt}\right) + \varsigma\right)$$

and $$k = \begin{cases} K\left|\frac{dx}{dt}\right| \text{ or } \left|\frac{dx}{dt}\right| \geq \chi \\ K\chi \text{ for } \left|\frac{dx}{dt}\right| < \chi \end{cases} \text{ where } \tanh\left(\frac{\alpha}{x}\chi\right) = 0.97, \text{ and } \chi = \frac{x}{\alpha}2.092\ldots$$

wherein:
K is a constant,
χ represents a boundary between rate-invariant and rate-dependent behavior, and
ς represents stress.

16. The method of claim 13, wherein the second finite-rate voltage scan associated with the state of dynamic equilibrium in which the scanned voltage follows the oxidation branch of the relationship between the OCV and the SOC is associated with lithiation of the electrode of the battery cell.

17. The method of claim 13, wherein the first finite-rate voltage scan associated with the state of dynamic equilibrium in which the scanned voltage follows the reduction branch of the relationship between the OCV and the SOC is associated with delithiation of the electrode of the battery cell.

18. A device for determining a state of charge (SOC) of a rechargeable battery cell that includes a lithiated electrode that exhibits a hysteretic relationship between SOC and an open-circuit voltage (OCV), comprising:
- a controller in communication with the battery cell, the controller including an instruction set, the instruction set executable to:
  - determine a rate-invariant charge/discharge relationship between the OCV and the SOC for the battery cell, including:
    - execute a first finite-rate voltage scan associated with a first state of dynamic equilibrium in which a scanned voltage follows a reduction branch of a relationship between the OCV and the SOC, and
    - execute a second finite-rate voltage scan associated with a second state of dynamic equilibrium in which the scanned voltage follows an oxidation branch of the relationship between the OCV and the SOC;
  - determine a rate-dependent charge/discharge relationship between the OCV and the SOC for the battery cell during a period in which the scanned voltage transitions between the reduction and oxidation branches;
  - dynamically determine an electrical potential for the battery cell; and
  - dynamically determine, via a controller, a present SOC state for the battery cell based upon the electrical potential for the battery cell, the rate-invariant charge/discharge relationship between the OCV and the SOC for the battery cell, and the rate-dependent charge/discharge relationship between the OCV and the SOC for the battery cell.

* * * * *